United States Patent [19]

Riediker et al.

[11] Patent Number: 4,548,891
[45] Date of Patent: Oct. 22, 1985

[54] PHOTOPOLYMERIZABLE COMPOSITIONS CONTAINING PREPOLYMERS WITH OLEFIN DOUBLE BONDS AND TITANIUM METALLOCENE PHOTOINITIATORS

[75] Inventors: Martin Riediker, Riehen; Ottmar Rohde, Basel; Martin Roth, Giffers; Niklaus Bühler, Marly, all of Switzerland

[73] Assignee: Ciba Geigy Corporation, Ardsley, N.Y.

[21] Appl. No.: 576,519

[22] Filed: Feb. 2, 1984

[30] Foreign Application Priority Data

Feb. 11, 1983 [CH] Switzerland .................... 785/83

[51] Int. Cl.$^4$ .................... G03C 1/70; G03C 5/16
[52] U.S. Cl. .................... 430/283; 430/287; 430/325; 430/330; 430/925; 430/916; 430/947; 430/284; 204/159.24; 204/159.18
[58] Field of Search .............. 430/915, 916, 947, 283, 430/284, 287, 925, 325, 330; 204/159.24, 159.18

[56] References Cited

U.S. PATENT DOCUMENTS

| | | | |
|---|---|---|---|
| 3,717,558 | 2/1973 | McGinniss | 430/916 X |
| 3,740,305 | 6/1973 | Hoback et al. | 528/28 X |
| 3,957,512 | 5/1976 | Kleeburg et al. | 96/35.1 |
| 4,030,948 | 6/1977 | Berger | 148/33.3 |
| 4,040,831 | 8/1977 | Rubner et al. | 430/283 X |
| 4,126,466 | 11/1978 | Roos | 96/84 UV |
| 4,173,673 | 11/1979 | Bratt et al. | 430/270 |
| 4,287,294 | 9/1981 | Rubner et al. | 430/306 |
| 4,329,419 | 5/1982 | Goff et al. | 430/283 |
| 4,414,312 | 11/1983 | Goff et al. | 204/159.19 X |
| 4,454,220 | 6/1984 | Goff | 430/283 X |

FOREIGN PATENT DOCUMENTS 65352 11/1982 European Pat. Off. .

OTHER PUBLICATIONS

Hsueh-Sung Tung and Carl H. Brubaker, Jr., *Inorganica Chimica Acta*, vol. 52, (1981), pp. 197–204.

R. Rubner, *Siemens Forsch.-u.Entwickl.-Ber.* Bd. 5 (1976), No. 2, pp. 92–97.

Kaeriyama, Kyoji et al., *Chemical Abstracts*, vol. 85, 1976, Columbus, Ohio, U.S.A., "Effect of Titanocene Dichloride as Sensitizer for Photopolymerization" Abstract No. 85:21953h, from *Sen'i Kobunshi Zairyo Kenkyusho Kenkyu Hokoku*, 1975, vol. 108, 21–27.

M. A. Chaudhari et al., *J. Organometal Chem.*, 2, 206, (1964).

C. Tamborski et al., *J. Organometal Chem.*, 4, 446, (1965).

*Primary Examiner*—Mark F. Downey
*Assistant Examiner*—Cynthia Hamilton
*Attorney, Agent, or Firm*—Luther A. R. Hall

[57] ABSTRACT

The invention relates to photopolymerizable compositions comprising (a) a prepolymer containing photopolymerizable olefinic double bonds, (b) photoinitiator of the formula

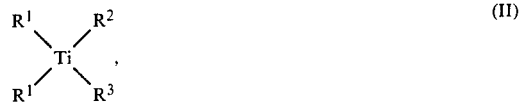

(II)

wherein $R^1$, $R^2$ and $R^3$ are as defined in claim 1, and optionally (c) an ester of acrylic or methacrylic acid or an allyl ether or allyl ester of a polyol.

Owing to their excellent light sensitivity, these compositions are suitable for the economic production of high temperature resistant protective layers and relief structures having excellent resolution and good contours.

21 Claims, No Drawings

PHOTOPOLYMERIZABLE COMPOSITIONS CONTAINING PREPOLYMERS WITH OLEFIN DOUBLE BONDS AND TITANIUM METALLOCENE PHOTOINITIATORS

The present invention relates to a photopolymerisable composition comprising polymer precursors containing photopolymerisable groups, a metallocene as photoinitiator and optionally acrylates, methacrylates, allyl ethers or allyl esters of polyols, to a substrate coated therewith and to a process for the production of relief images.

German Offenlegungsschrift No. 2 308 830 describes a process for producing relief structures, which comprises exposing photopolymerisable prepolymers such as polyamide esters imagewise, removing unexposed parts with a developer and subsequently baking the image so obtained, the prepolymer forming the structure being converted into a polymer which is resistant at elevated temperatures.

To increase the light-sensitivity of such photopolymerisable prepolymers it is usual to add photoinitiators and photosensitizers to the compositions, as described e.g. in German Offenlegungsschrift No. 2919841. However, the sensitivity achieved with these compositions is still not sufficient for good economic results to be obtained with short exposure times.

Accordingly, it has been proposed in U.S. Pat. No. 4 329 419 to add a polyfunctional acrylate compound and an aromatic bisimidazole as photoinitiator to a polyamide ester prepolymer. This proposal is unsatisfactory in a number of respects. The compositions disclosed in this reference contain a fairly large number of volatile organic constituents, so that the relief structures prepared therefrom undergo considerable shrinkage both in horizontal and vertical direction on being heated to 300°–400° C., with the result that the relief structure deviates quite substantially from the original mask image. It can be inferred from U.S. Pat. No. 4 329 419 that an exposure energy of 50 to 120 mJ/cm$^2$ is required in order to produce a true reproduction of the mask at an original layer thickness of 1.25 μm. After exposure to heat, the layer thickness is only 0.45 μm.

Further, it has proved difficult to obtain satisfactory results at layer thicknesses of >20 μm. The individual absorption of the polymers at wavelengths of <420 nm has the effect that the lower-lying parts of the layer are underexposed as compared with the higher-lying parts. It is therefore very difficult to produce fairly high relief profiles with sharp definition and to prevent the relief structures from becoming detached from the surface of the substrate.

In European patent application No. 65352 there are also described photopolymerisable compositions which contain a polyamic acid, a bisazide as crosslinking agent, a tertiary amine containing olefinically unsaturated bonds and optionally a photosensitizer. The amines form ionic bonds with the carboxyl groups of the polyamic acid, which bonds then react with the nitrenes formed from the bisazides under exposure.

These systems contain in some cases very high concentrations of strongly absorbing sensitizers and are not suitable for the production of relief structures of a fairly substantial layer thickness.

However, high-resolution relief structures of substantial layer thickness and having sharp definition are required for utilities as described e.g. in European patent application No. 68 414. It has also proved very important to keep to a minimum the addition of volatile organic substances during the production of relief structures of substantial layer thickness, and thereby the contraction of the material during the application of heat, because otherwise cracks and separation are observed in addition to the uneconomic reduction in layer thickness.

It is desirable to sensitize photopolymerisable polymer precursors (prepolymers) of thermostable organic materials such that
- a high light sensitivity at wavelengths above 400 nm is obtained
- as small an amount as possible of photoactive constituents is added in order to ensure economic exposure times
- the photoinitiator itself or its constituents are thermostable materials, and
- it is possible to use e.g. argon lasers as light sources.

Accordingly, the present invention provides a photopolymerisable composition which comprises, in addition to conventional ingredients, e.g. solvents,
(a) a prepolymer which contains identical or different recurring structural units of the formula I

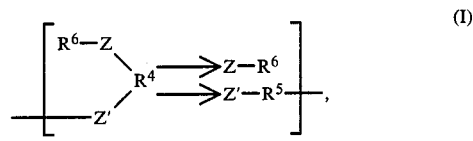

and which reacts, when heated, to form a thermostable ring structure,
(b) a photoinitiator, and optionally
(c) an ester of acrylic or methacrylic acid, an allyl ether or an allyl ester or a partial ester of said acids with a polyol, wherein the photoinitiator (b) is a metallocene of the formula II

wherein
$R^1$ is each independently unsubstituted or substituted cyclopentadienyl$^\ominus$, indenyl$^\ominus$, or both symbols $R^1$ together are an unsubstituted or substituted radical of the formula III

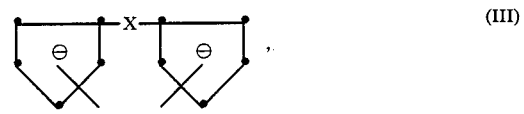

$R^2$ is carbocyclic or 5- or 6-membered heterocyclic aromatic ring which is substituted in at least one of the two ortho-positions relative to the metal-carbon bond by a fluorine atom and which may contain further substituents, $R^3$ is $C_3$–$C_5$alkynyl, substituted or unsubstituted phenylalkynyl containing 3 to 5 carbon atoms in the alkynyl moiety, $N_3$, CN, $Si(R^7)_3$ or $Sn(R^7)_3$, or has the meaning of $R^2$, or $R^2$ and $R^3$ together are a radical of the formula IV

—Q—Y—Q—  (IV),

R[4] is a tetravalent aromatic radical after removal of four functional groups, with any two functional groups being adjacent and → denoting structural isomers, R[5] is a divalent aliphatic, cycloaliphatic or monocyclic or polycyclic aromatic radical, and aromatic radicals R[5] may contain a —CONH$_2$ or —COOH group in the ortho-position to the bond to Z', R[6] is radical containing a photopolymerisable olefinic double bond, R[7] is $C_1$-$C_{12}$alkyl, $C_5$-$C_{12}$cycloalkyl, $C_6$-$C_{16}$aryl or $C_7$-$C_{16}$aralkyl, Z is a covalent or ionic bond and Z' is a covalent bond, with the proviso that, on heating the photopolymerisable composition to remove the radical R[6], Z and Z', optionally together with —CONH$_2$ or —COOH groups contained in R[5], form a thermostable ring system, X is (CH$_2$)$_n$, in which n is 1, 2 or 3, $C_2$-$C_{12}$alkylidene, cycloalkylidene containing 5 to 7 ring carbon atoms, Si(R[7])$_2$ or Si(R[7])$_2$, Q is a carbocyclic or heterocyclic 5- or 6-membered aromatic ring, each of the two bonds being in the ortho-position to the group Y and each meta-position to the group Y being substituted by a fluorine atom, and Q may contain further substituents, and Y is CH$_2$, $C_2$-$C_{12}$alkylidene, cycloalkylidene containing 5 to 7 ring carbon atoms, a direct bond, NR[7], O, S, SO, SO$_2$, CO, Si(R[7])$_2$ or Sn(R[7])$_2$.

The photopolymerisable compositions of this invention based on photopolymerisable prepolymers have a high light sensitivity over a wavelength range from UV light to visible light, can be photopolymerised in very thin layers (e.g. 0.05 to 4 μm) and in thicker layers (e.g. 20 to 500 μm), and produce photographic relief structures of high resolution and accurate images which have a fairly low contraction when subjected to heat, and also make possible the economic production of relief structures of substantial thickness.

The concurrent use of component (c) is not obligatory in the practice of this invention; however, it is preferred, as it is thereby possible to increase substantially the light sensitivity of the photopolymerisable composition (shortening of the exposure times). The composition preferably contains the photoinitiator (b) in an amount of 0.1 to 20% by weight, most preferably of 0.5 to 10% by weight, based on component (a) or on components (a) and (c). The composition preferably contains component (a) in an amount of 50 to 97.5% by weight, most preferably of 70 to 95% by weight, and component (c) preferably in an amount of 2.5 to 50, most preferably of 5 to 30% by weight. The most preferred compositions are those which contain 85 to 90% by weight of component (a) and 10 to 15% by weight of component (c).

In the prepolymers (a), the symbols R[4], R[5], R[6], Z and Z' in the individual structural units may have identical or different meanings. The individual structural units of copolymers can be in random distribution, or the polymers can be block copolymers which can be obtained by methods known per se by linking different blocks together. If Z is an ionic bond, cyclised derivatives obtained from structural units of the formula I can also be linked to prepolymers containing recurring structural units.

The average molecular weight ($\overline{M}_w$) of the polymer precursors is preferably 5000 to 100,000, in particular 5000 to 50,000 and, most preferably, 10,000 to 30,000.

The average molecular weights can be determined and compared e.g. by gel permeation chromatography with polystyrene calibration.

Aromatic radicals R[4] can be mono- or polycyclic and unsubstituted or substituted, e.g. by halogen atoms or $C_1$-$C_4$alkyl or $C_1$-$C_4$alkoxy groups. R[4] is e.g. a naphthalene, phenanthrene or perylene radical and, in particular, is a radical of the formula V or VI

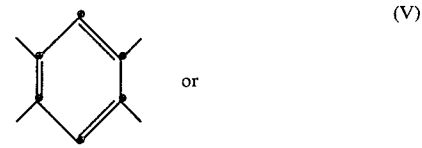

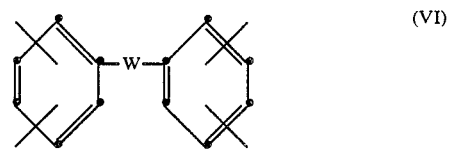

wherein W is a direct bond, O, CO, CH$_2$, C(CF$_3$)$_2$, S, SO, SO$_2$, NH or $C_2$-$C_{12}$alkylidene. Most preferably, R[4] is the radical of pyromellitic dianhydride, of a benzophenonetetracarboxylic acid dianhydride or of a mixture thereof.

R[5] as an aliphatic radical preferably contains 2 to 20 carbon atoms and may be linear or branched alkylene which can be interrupted by silane or siloxane groups. R[5] as a cycloaliphatic radical preferably contains 5 to 7 ring carbon atoms and is in particular cyclohexylene, cyclopentylene or the radical of isophoronediamine. R[5] is preferably an aromatic radical of preferably 6 to 16 carbon atoms which may also be substituted, e.g. by halogen atoms, OH, —COOH, —CONH$_2$, or $C_1$-$C_4$alkyl or $C_1$-$C_4$alkoxy groups. Most preferably, R[5] is a radical of the formula VII, VIII or IX

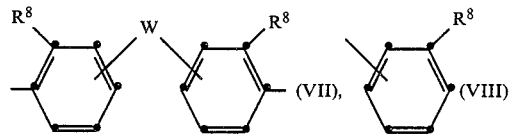

or

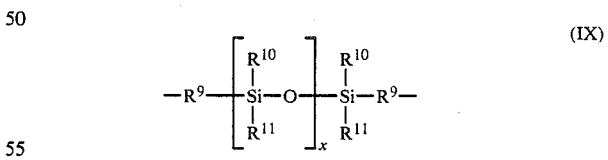

wherein

W has the meaning assigned to it above and is preferably O, CH$_2$ or C(CF$_3$)$_2$, x is an integer from 1 to 10, preferably from 1 to 5 and, most preferably, is 1, R[8] is each independently hydrogen, —CONH$_2$ or —COOH, R[9] is —$C_pH_{2p}$—, wherein p=1 to 5, and R[10] and R[11] are each independently straight chain or branched $C_1$-$C_6$alkyl, preferably methyl.

Preferred radicals of the formulae VII and VIII are radicals which are attached in the para- or 4,4'-position.

The group $R^6$ preferably has the formula X

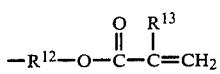 (X)

wherein $R^{12}$ is —$C_mH_{2m'}$— in which m is a value from 2 to 12, such as ethylene, 1,2- or 1,3-propylene, 1,2-, 1,3- or 1,4-butylene, n-pentylene, n-hexylene, n-octylene or n-dodecylene, —$CH_2CH(OH)CH_2$— or polyoxaalkylene containing 4 to 30 carbon atoms, e.g. the radicals of diethylene glycol, triethylene glycol, tetraethylene glycol, polyethylene glycol or polypropylene glycol, and $R^{13}$ is a hydrogen atom or methyl. If Z is —COO—, $R^6$ can also be —CH=CH$_2$, —CH$_2$CH=CH$_2$ or —CH$_2$C(CH$_3$)=CH$_2$. $R^{12}$ is preferably ethylene, 1,2- or 1,3-propylene or —CH$_2$CH(OH)CH$_2$— and $R^{13}$ is preferably methyl.

Preferred polymer precursors (a) are those in which $R^5$ is 0 to 100% of the recurring structural units is a radical of the formula VII and in 100 to 0% of the recurring structural units is a radical of the formula VIII, and also prepolymers in which $R^5$ in 70 to 100% of the recurring structural units, is a radical of the formula VII and/or VIII, and in 30 to 0% of the recurring structural units is a radical of the formula IX.

Z can be covalent or ionic bond. Suitable ionic bonds are in particular those between carboxyl groups and tertiary amines. Z is preferably —COO—, —CONH—, —O—, —NH—, —COOH/$NR^{14}R^{15}$— or

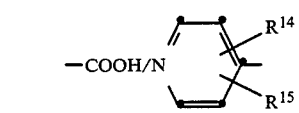

wherein each of $R^{14}$ and $R^{15}$ independently is alkyl or alkenyl, each having up to 6 carbon atoms. Preferably each is methyl. Z' is preferably —CONH—, —NH-CO—, —NH—CO—NH— or —O—CO—NH—. Most preferably, Z is —CONH—, —COO— or —COOH/N(CH$_3$)$_2$— and Z' is —CONH—, or Z is —O— and Z' is —NHCO—.

When the photopolymerisable composition is heated and the $R^6$ groups are removed, the groups Z and Z', optionally together with —CONH$_2$ or —COOH groups contained in $R^5$, must form thermostable ring structures. Depending on the nature of the groups Z and Z', these ring structures may be ($R^4$ = 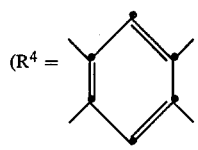

and $R^5$ = aromatic radical Ar, which can also be a constituent of the ring structure):

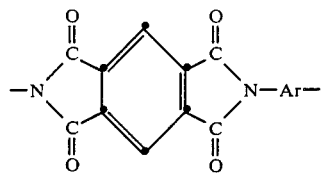

(A, polyimides),

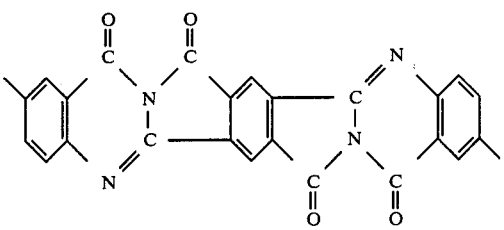

[B, poly(isoindoloquinazolidinediones)],

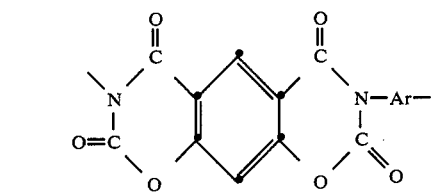

[C, poly(oxazinediones)],

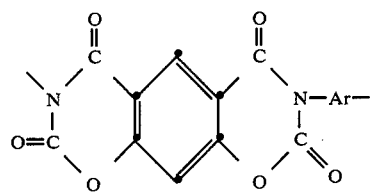

[D, poly(quinazolinediones)],

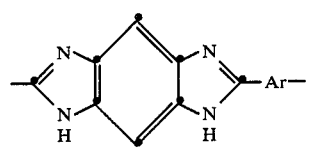

[E, poly(imidazoles)],

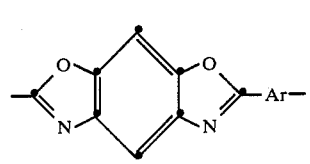

[F, poly(oxazoles)] and

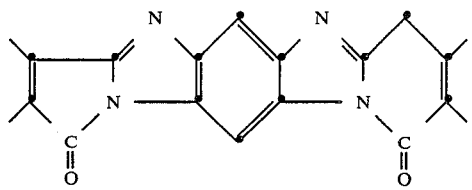

[G, poly(imidazopyrrolones)].

The formation of these ring structures and the preparation of the corresponding prepolymers can be illustrated e.g. as follows:

Process I

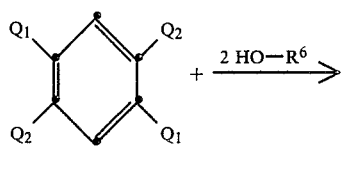

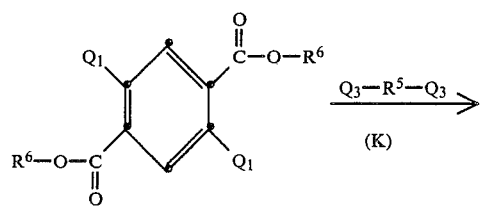

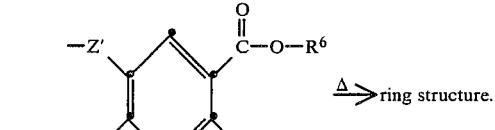

Process IIa

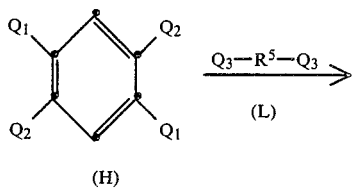

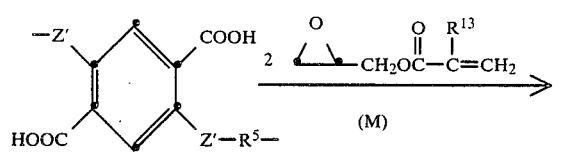

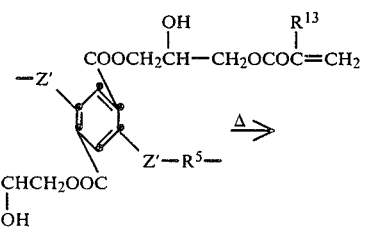

ring structure or

-continued

Process IIb

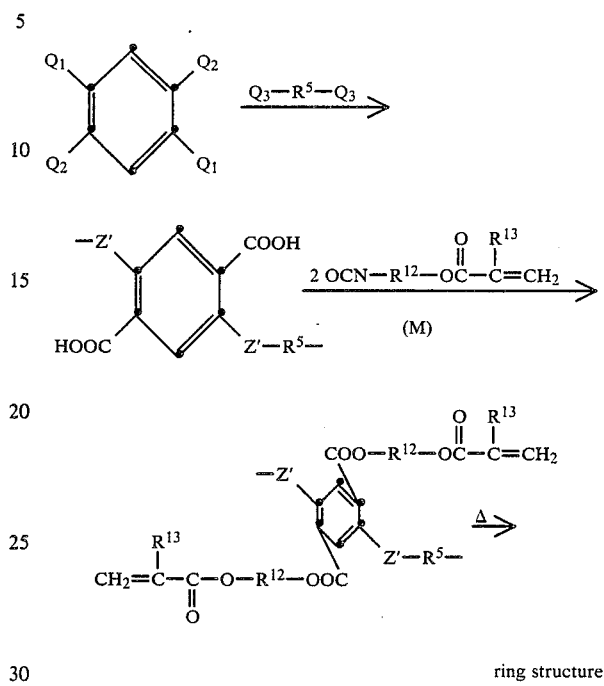

ring structure.

In the above formulae, $Q_1$ is e.g. COOH, COCl, $NH_2$ or OH, or $Q_1$ and $Q_2$ together form —CO—O—CO—, and $Q_3$ is e.g. $NH_2$ or NCO. In these processes it is possible to prepare identical polymers, e.g. via prepolymers containing the structural units

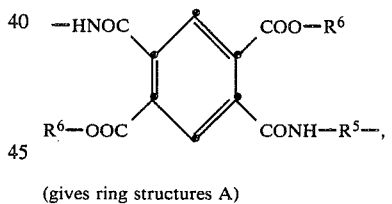

(gives ring structures A)

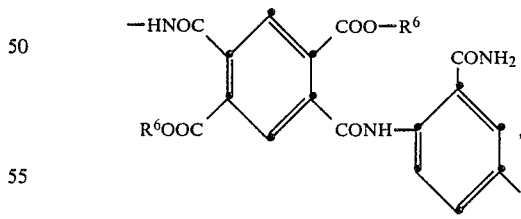

(gives ring structures B)

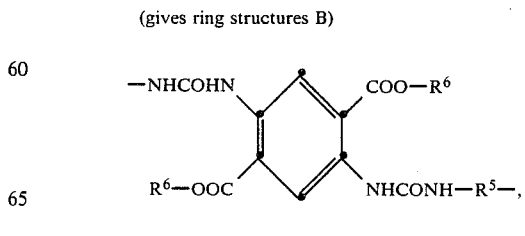

(gives ring structures D)

-continued

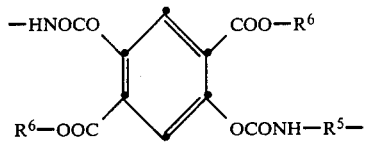

(gives ring structures C).

Process III

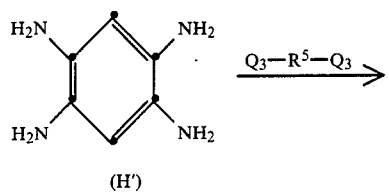

(H')

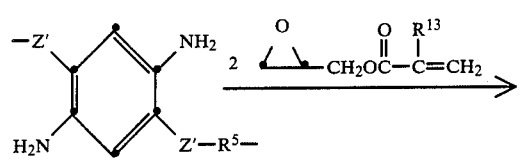

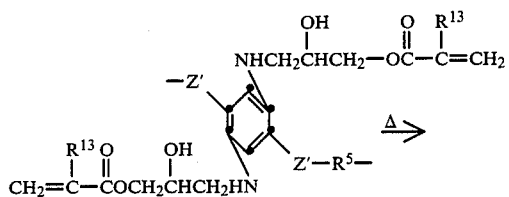

ring structure.

Q3 in this case is e.g. COCl or together with an orthocarboxyl group at an aromatic radical R⁵ forms an anhydride grouping. In this process, it is possible to prepare e.g. prepolymers containing the following structural units:

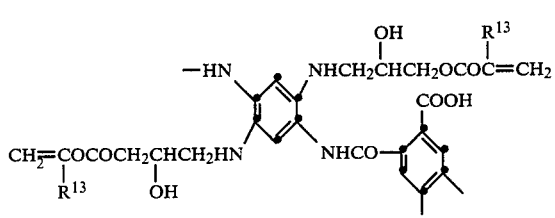

(gives ring structures G)

and

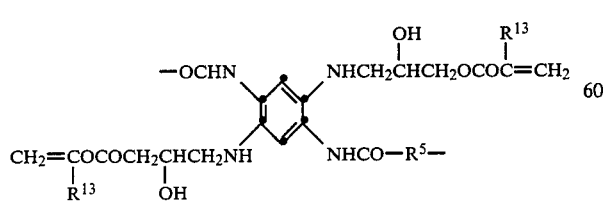

(gives ring structures E).

Process IV

-continued

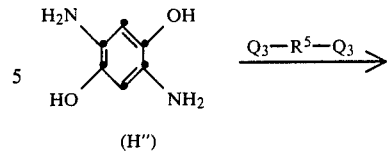

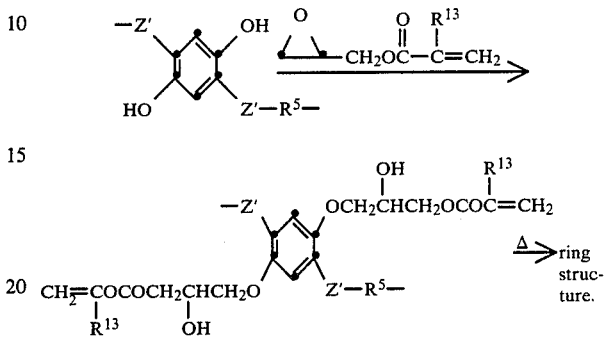

$Q_3$ is in this case e.g. COCl. In this process it is possible to prepare prepolymers containing structural units of the formula

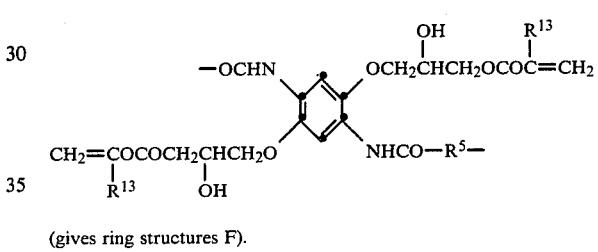

(gives ring structures F).

Prepolymers in which Z is —COOH/NR¹⁴R¹⁵— or

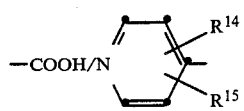

can be prepared in accordance with the process described in European patent application No. 65352.

Particularly preferred prepolymers are those which contain recurring structural units of the formula Ia

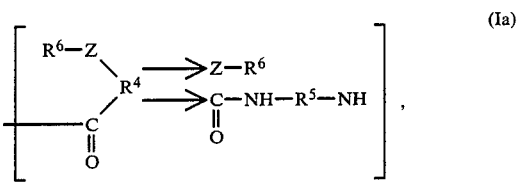

wherein $R^4$ is the tetravalent radical of an aromatic tetracarboxylic acid after removal of 4 carboxyl groups and $R^5$, $R^6$ and Z are as defined for formula I. Z is in this case preferably —CO—O—.

Further preferred prepolymers are those which contain recurring structural units of the formula Ib

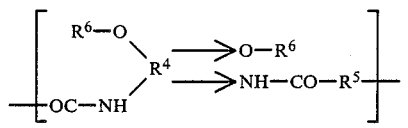

wherein $R^4$ is the radical of 3,3'-dihydroxybenzidiene, each $R^5$ in the individual recurring structural units is independently the radical of isophthalic acid or of 4,4'-benzophenonedicarboxylic acid, and $R^6$ is as defined for formula I.

The structural isomerism indicated by → can be shown e.g. with pyromellitic acid as follows (Z=—CO—O—):

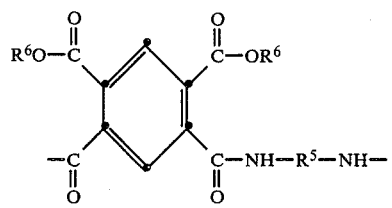

or

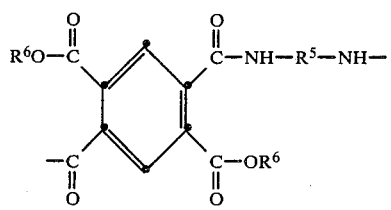

The prepolymers (a) are known or they can be prepared by methods known per se (q.v. the above reaction scheme or U.S. Pat. No. 4 329 419 and 4 030 948).

Examples of suitable compounds H, H' and H" for the preparation of the prepolymers (a) are: 2,3,9,10-perylenetetracarboxylic dianhydride, 1,4,5,8-, 2,3,6,7-, 1,2,4,5- and 1,2,5,6-naphthalenetetracarboxylic dianhydride, 2,6-dichloronaphtahlene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyromellitic dianhydride, 2,3,3',4'-, 3,3',4,4'- and 2,2',3,3'-benzophenonetetracarboxylic dianhydride, 2,2',3,3'- and 3,3',4,4'-biphenyltetracarboxylic dianhydride, 4,4'-isopropylidenediphthalic anhydride, 3,3'-isopropylidenediphthalic anhydride, 3,3'- and 4,4'-oxydiphthalic anhydride, 4,4'-sulfonyldiphthalic anhydridhe, 4,4'-methylenediphthalic anhydride, 4,4'-thiodiphthalic anhydride, 4,4'-ethylidenediphthalic anhydride, benzene-1,2,3,4-tetracarboxylic dianhydride, 1,2,4,5-tetraaminobenzene, 1,4-diamino-2,5-dihydroxybenzene, 1,4-dicarboxy-2,5-dihydroxybenzene.

Examples of compounds K for the preparation of the prepolymers (a) are:
m- and p-phenylenediamine, 4,4'- and 3,3'-diaminobiphenyl, 4,4'- and 3,3'-diaminodiphenyl ether, 4,4'- and 3,3'-diaminodiphenylmethane, 4,4'- and 3,3'-diaminodiphenylsulfone, 4,4'- and 3,3'- thiodianiline, bis-(4-aminophenyl)bis(trifluoromethyl)methane, 4,4'-diaminobenzophenone, 1,5-diaminonaphthalene, bis-(4-aminophenyl)dimethylsilane, bis-(4-aminophenyl)diethylsilane, bis-(4-aminophenyl)diphenylsilane, bis-(4-aminophenyloxy)dimethylsilane, 4,4'-methylenebis-(o-chloroaniline), 4,4'-methylenebis-(3-methylaniline), 4,4'-methylenebis-(2-ethylaniline), 4,4'-methylenebis-(2-methoxyaniline), 5,5'-methylenebis-(2-aminophenol), 4,4'-methylenebis-(2-methylaniline), 4,4'-oxybis-(2-methoxyaniline), 4,4'-oxybis-(2-chloroaniline), 5,5'-oxybis-(2-aminophenol), 4,4'-thiobis(2-methylaniline), 4,4'-thiobis-(2-methoxyaniline), 4,4'-thiobis(2-chloroaniline), 4,4'-sulfonylbis-(2-methylaniline), 4,4'-sulfonylbis-(2-ethoxyaniline), 4,4'-sulfonylbis(2-chloroaniline), 5,5'-sulfonylbis(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-oxydianiline, 4,4'-isopropylidenedianiline, 3,3'-dichlorobenzidine, 3,3'-dimethylbenzidine, 3,3'-dimethoxybenzidine, 3,3'-dicarboxybenzidine, diaminotoluene, 4,4'-methylenebis(3-carboxyaniline) and the esters thereof, 4,4'-diamino-3-carboxamidodiphenyl, 4,4'-diamino-3,3'-bicarboxamidobiphenyl, 4,4'-diamino-3-carboxamidodiphenyl ether, 4,4'-diamino,3,3'-bis-carboxamidodiphenyl ether, 4,4'-diamino-3-carboxydiphenyl ether, 4,4'-diamino-3,3'-dicarboxydiphenyl ether, 4,4'-diisocyanatodiphenyl ether, diphenyl ether-4,4'-dicarboxylic acid chloride, isophthaloyl dichloride, 1,3- and 1,4-phenylenediisocyanate and pyromellitic dianhydride.

Particularly preferred compositions are those in which the prepolymer (a) consists of recurring structural units of the formula Ic

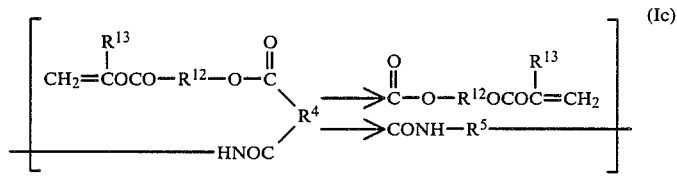

wherein $R^4$ is the radical of pyromellitic dianhydride, of a benzophenonetetracarboxylic dianhydride or is a mixture of such radicals, each $R^5$ in the individual recurring units is independently 1,3- or 1,4-phenylene, the radical of 4,4'-diaminodiphenyl ether, 4,4'-diaminodiphenylmethane, 2,2-bis(4,4'-diaminodiphenyl)hexafluoropropane, 4,4'-diamino-3-carboxamidodiphenyl ether or 4,4'-diamino-3,3'-biscarboxamidobiphenyl, $R^{12}$ is —$CH_2CH_2$— or —$CH_2CH(OH)CH_2$— and $R^{13}$ is a hydrogen atom or methyl; and also compositions in which the prepolymer (a) consists of recurring structural units of the formula Id

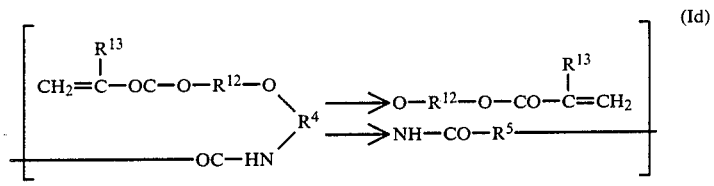

(Id)

wherein $R^4$ is the radical of 3,3'-dihydroxybenzidine, each $R^5$ in the individual recurring structural units is independently 1,3-phenylene or the radical of 4,4'-benzophenonedicarboxylic acid, $R^{12}$ is —CH$_2$CH$_2$—, —CH$_2$CH$_2$CH$_2$— or —CH$_2$—CH(OH)—CH$_2$—, and $R^{13}$ is a hydrogen atom or methyl.

Specific mention is made of prepolymers containing recurring structural units of the formulae Ie to Ik:

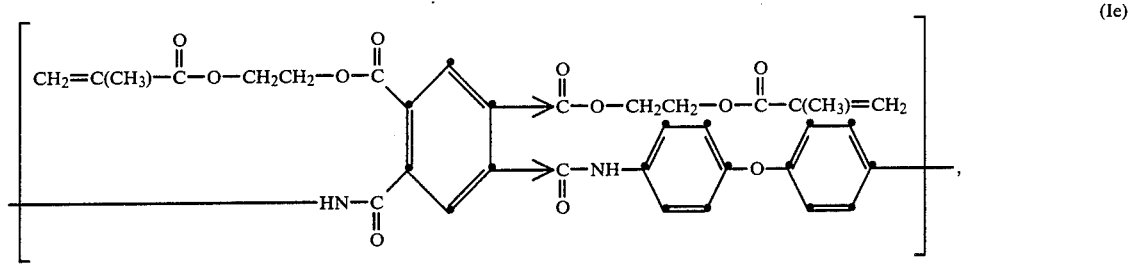

(Ie)

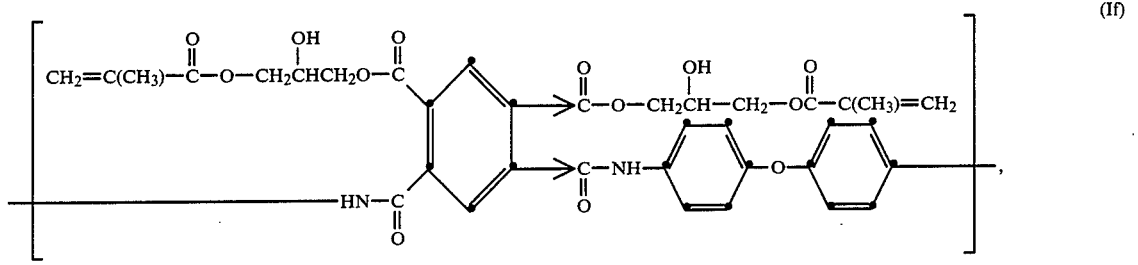

(If)

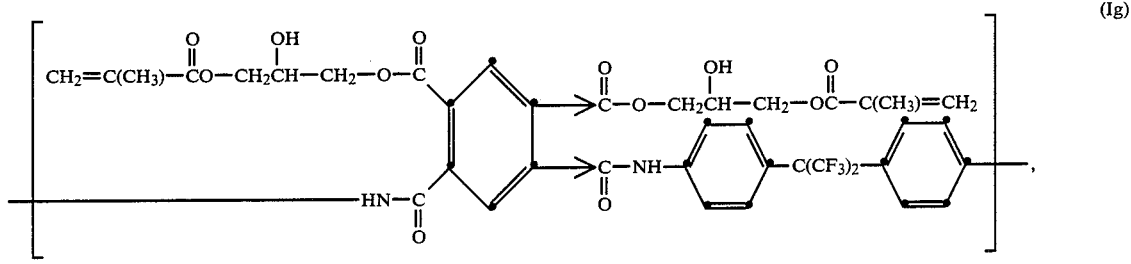

(Ig)

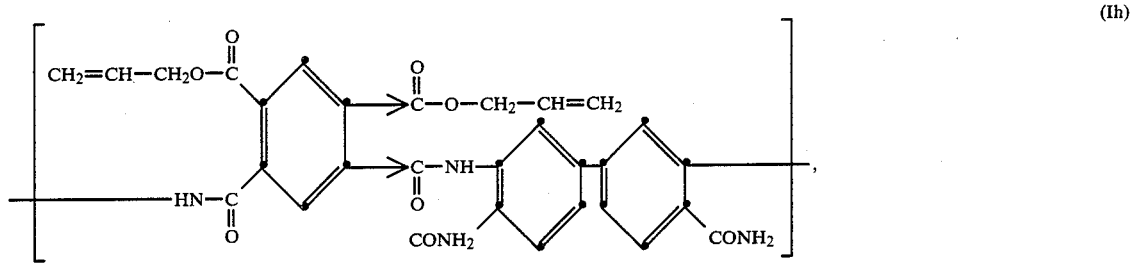

(Ih)

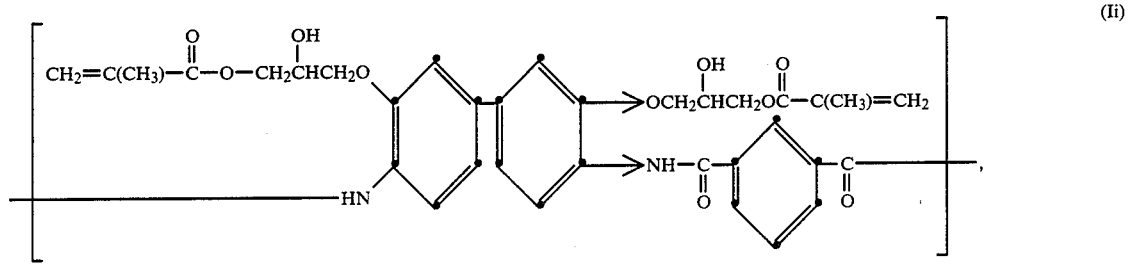

(Ii)

-continued

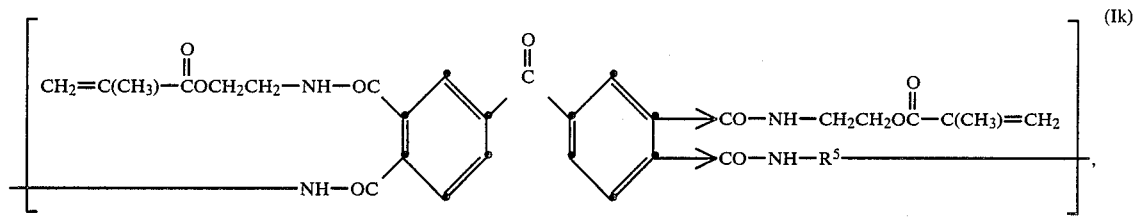

wherein $R^5$ in 70% of the structural units is

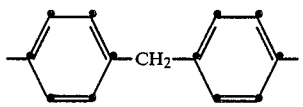

and, in 30% of the structural units, is

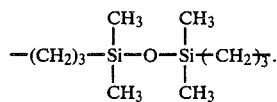

The metallocenes of the formula II are known [q.v. J. Organomet. Chem., 2 (1964), pp. 206–212, and J. Organomet. Chem. 4 (1965), pp. 446–445] or they can be prepared by corresponding methods.

The $R^1$ groups are preferably identical. Suitable substituents for $R^1$ are: linear or branched alkyl, alkoxy and alkenyl of preferably up to 18, especially up to 12 and most preferably up to 6, carbon atoms, e.g. methyl, ethyl, propyl, isopropyl, n-butyl, tert-butyl, pentyl, hexyl, octyl, decyl, dodecyl, tetradecyl, hexadecyl, octadecyl and corresponding alkenyl and alkoxy groups; cycloalkyl and cycloalkenyl containing preferably 5 to 8 ring carbon atoms, e.g. cyclopentyl, cyclohexyl, cycloheptyl, methylcyclopentyl and methylcyclohexyl; aryl of preferably 6 to 16 carbon atoms and aralkyl of preferably 7 to 16 carbon atoms, e.g. phenyl, naphthyl, biphenyl, benzyl and phenylethyl; nitrilo, halogen, preferably F, Cl and Br, and also amino, preferably tertiary amino which may contain linear or branched alkyl groups of 1 to 12, preferably 1 to 6, carbon atoms, in particular methyl or ethyl, or phenyl and benzyl, which amino groups can also be quaternised, in particular with linear or branched alkyl halides containing preferably 1 to 12 carbon atoms, preferably methyl or ethyl halides; linear or branched aminoalkyl, preferably tertiary aminoalkyl which may also be quaternised, in particular with alkyl halides, and the alkylene group in the aminoalkyl can be linear or branched and contains preferably 1 to 12, most preferably 1 to 6, carbon atoms, and is most preferably α-branched $C_1$–$C_{12}$alkyl.

The radicals $R^1$ may contain 1 to 3 substituents, but preferably contain one substituent. It is preferred that both substituents $R^1$ are cyclopentadienyl$^\ominus$ or methylcyclopentadienyl$^\ominus$.

Alkylidene groups X, Y and W preferably contain 2 to 6 carbon atoms. Exemplary of alkylidene groups X, Y and W and cycloalkylidene groups X and Y are ethylidene, 2,2-propylidene, butylidene, hexylidene, phenylmethylene, diphenyl-methylene, cyclopentylidene and cyclohexylidene. X is most preferably methylene. $R^4$ as alkyl preferably contains 1 to 6 carbon atoms and is e.g. methyl, ethyl, propyl, butyl or hexyl; $R^4$ as cycloalkyl is preferably cyclopentyl or cyclohexyl; and as aryl is preferably phenyl; and as aralkyl is preferably benzyl.

$R^2$ is preferably substituted in both ortho-positions by fluorine.

$R^2$ as carbocyclic aromatic and fluorine-substituted ring may be indene, indane, fluorene, naphthalene and preferably phenyl. Examples are: 4,6-difluoroinden-5-yl, 5,7-difluoroind-6-yl, 2,4-difluorofluoren-3-yl, 1,3-difluoronaphth-2-yl and, preferably, 2,6-difluorophen-1-yl.

$R^2$ as heterocyclic aromatic 5-membered ring preferably contains one hetero-atom and, as 6-membered ring, contains preferably 1 or 2 hetero-atoms. Examples of such rings substituted by two fluorine atoms are: 2,4-difluoropyrrol-3-yl, 2,4-difluorofur-3-yl, 2,4-difluorothiophen-3-yl, 2,4-difluoropyrid-3-yl, 3,5-difluoropyrid-4-yl and 4,6-difluoropyrimid-5-yl.

$R^2$ and $R^3$ together as radical of the formula IV may be e.g.:

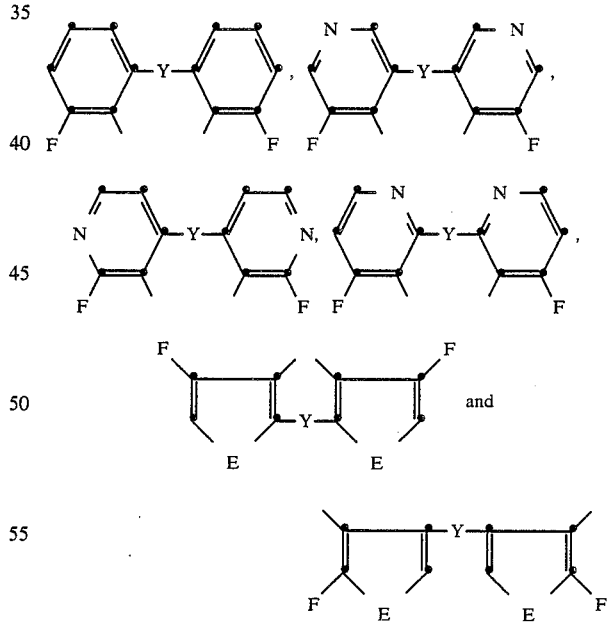

wherein E is O, S or NH. Y is preferably methylene, ethylidene, 2,2-propylidene, a direct bond, or O.

The radicals $R^2$ and the groups Q in radicals of the formula IV can be partly or completely substituted by further groups. Suitable groups are: linear or branched alkyl or alkoxy, each preferably of 1 to 18, most preferably 1 to 6, carbon atoms, e.g. methyl, ethyl, propyl, butyl, pentyl, hexyl, and the corresponding alkoxy groups, with methyl and methoxy being preferred;

cycloalkyl containing preferably 5 or 6 ring carbon atoms, aryl of preferably 6 to 16 carbon atoms and aralkyl of preferably 7 to 16 carbon atoms, e.g. cyclopentyl, cyclohexyl, phenyl or benzyl; hydroxyl, carboxyl, CN, halogen such as F, Cl or Br, and amino, preferably tertiary amino which may be quaternised with an alkyl halide such as methyl chloride, methyl bromide or methyl iodide, examples of amino groups being methylamino, ethylamino, dimethylamino, diethylamino, pyrrolidyl, piperidyl, piperazyl, morpholyl, N-methylpiperazyl;

alkoxycarbonyl containing preferably 1 to 18, most preferably 1 to 6, carbon atoms in the alkoxy moiety, aminocarbonyl containing one or two $C_1$–$C_{12}$alkyl groups in the amino group, or aminocarbonyl containing heterocyclic amines such as pyrrolidine, piperidine, piperazine, N-methylpiperazine, and morpholine;

aminoalkyl, especially tertiary aminoalkyl which preferably contains $C_1$–$C_6$alkyl groups and which may be quaternised with an alkyl halide, most preferably tertiary aminoalkyl which may be substituted by $C_1$–$C_6$alkyl, e.g. dimethylaminomethyl and trimethylammoniummethyl iodide.

$R^3$ as alkynyl is e.g. 2-butynyl and, preferably, propargyl.

Examples of substituents for $R^3$ as phenylalkynyl are halogen such as F, Cl, Br, $C_1$–$C_6$alkyl and $C_1$–$C_6$alkoxy, carboxyl, OH and CN. $R^3$ preferably has the meaning of $R^2$.

In a preferred embodiment of the invention, $R^2$ and $R^3$ in formula II are unsubstituted or substituted 2,6-difluorophen-1-yl or $R^2$ and $R^3$ together form a radical of the formula XI

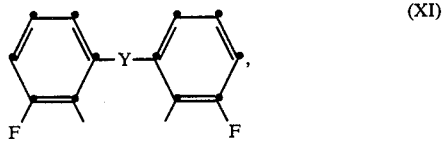

(XI)

wherein Y has the above meaning and is in particular a direct bond, $CH_2$ or O.

A preferred group of metallocenes of the formula II comprises those compounds wherein each $R^1$ is π-cyclopentadienyl or π-cyclopentadienyl which is substituted by $C_1$–$C_4$alkyl, preferably methyl, and each of $R^2$ and $R^3$ is a radical of the formula XII

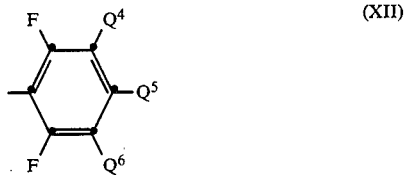

(XII)

wherein each of $Q^4$, $Q^5$ and $Q^6$ independently is a hydrogen atom, F, Cl, Br or a tertiary amino group, preferably a morpholino group. The amino group is preferably attached in the para-position to the free bond. A preferred subgroup comprises those metallocenes of the formula II, wherein each $R^1$ is π-methylcyclopentadienyl and, most preferably, π-cyclopentadienyl, and each of $R^2$ and $R^3$ is a radical of the formula XII, wherein $Q^4$ and $Q^6$ are H, F, Cl or Br and $Q^5$ is H or F. Preferably, each of $Q^4$, $Q^5$ and $Q^6$ independently is a hydrogen or fluorine atom, and most preferably each is fluorine.

Suitable for use as component (c) are e.g. ethers as defined herein and, in particular, esters and partial esters of acrylic and methacrylic acid and of aromatic and, in particular, aliphatic polyols containing preferably 2 to 30 carbon atoms, or of cycloaliphatic polyols containing preferably 5 or 6 ring carbon atoms. These polyols can also be modified with epoxides such as ethylene oxide or propylene oxide. The partial esters and esters of polyoxaalkylene glycols are also suitable. Examples of components (c) are: ethylene glycol dimethacrylate, diethylene glycol dimethacrylate, triethylene glycol dimethacrylate, tetraethylene glycol dimethacrylate, polyethylene glycol dimethacrylates having an average molecular weight in the range from 200 to 2000, ethylene glycol diacrylate, diethylene glycol diacrylate, triethylene glycol diacrylate, tetraethylene glycol diacrylate, polyethylene glycol diacrylates having an average molecular weight in the range from 200 to 2000, trimethylolpropane ethoxylate trimethacrylate, trimethylolpropane polyethoxylate trimethacrylates having an average molecular weight in the range from 500 to 1500, trimethylolpropane ethoxylate triacrylates having an average molecular weight in the range from 500 to 1500, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethylacrylate, 1,3-butanediol dimethacrylate, sorbitol triacrylate, sorbitol tetraacrylate, sorbitol tetramethacrylate, sorbitol pentaacrylate, sorbitol hexaacrylate, oligoester acrylates, oligoester methacrylates, glycerol di- and triacrylate, 1,4-cyclohexane diacrylate, bisacrylates and bismethacrylates of polyethylene glycols having an average molecular weight from 100 to 1500, ethylene glycol diallyl ether, 1,1,1-trimethylolpropane triallyl ether, pentaerythritol triallyl ether, diallyl succinates and diallyl adipates or mixtures of the above compounds.

The composition of this invention can contain further conventional ingredients, e.g. stabilisers, especially inhibitors of thermal polymerisation, such as thiodiphenylamine and alkylphenols, e.g. 4-tert-butylphenol, 2,5-di-tert-butylhydroquinone or 2,6-di-tertbutyl-4-methylphenol. Further suitable initiators and sensitisers are for example: aromatic ketones such as tetramethyldiaminobenzophenone, benzophenone, Michler's ketone [4,4'-bis(dimethylamino)-benzophenone], 4,4'-bis(-diethylamino)benzophenone, 4-acryloxy-4'-diethylaminobenzophenone, 4-methoxy-4'-dimethylaminobenzophenone, 2-ethylanthraquinone, phenanthraquinone, 2-tert-butylanthraquinone, 1,2-benzanthraquinone, 2,3-benzanthraquinone, 2,3-dichloronaphthoquinone, benzyl dimethyl ketal and other aromatic ketones, e.g. those referred to in U.S. Pat. No. 3 552 973; benzoin, benzoin ethers such as benzoin methyl ether, benzoin ethyl ether, benzoin isobutyl ether and benzoin phenyl ether, methyl benzoin, ethyl benzoin and other benzoins; p-maleimidobenzenesulfonazide, thioxanthone derivatives such as thioxanthone, 2-chlorothioxanthone, 2-isopropylthioxanthone, ethyl thioxanthone-1-carboxylate, ethyl 3-methoxythioxanthone-1-carboxylate in combination with aromatic amines such as ethyl p-dimethylaminobenzoate and 4,4'-bis(dimethylamino)benzophenone; bisazides such as 2,6-(4'-azidobenzylidene-4-methylcyclohexan-1-one. Further ingredients are solvents, which may be used alone or in combinations, e.g. N-methylpyrrolidone, butyrolactone, ethylene glycol monoethyl ether, dimethylformamide, dimethylacetamide and hexamethylphosphoric triamide; pigments, dyes, fillers, adhesives, wetting agents, and plasticizers, as well as dyes which are able to influence the spectral sensitivity of the compositions by their individual absorption.

The compositions of the invention are prepared by mixing the components in suitable mixers.

The compositions of the invention are most suitable as coating agents for substrates of all kinds, e.g. ceramics, metals such as copper and aluminium, semimetals and semi-conductor materials such as silicon, germanium, GaAs, $SiO_2$ and $Si_3N_4$ layers, to which it is desired to apply a protective layer or a photographic image by photopolymerisation. The invention also relates to the substrates so coated and to a process for applying photographic images, in particular relief structures, to said substrates.

The coated substrates can be produced e.g. by preparing a solution or suspension of the composition.

The choice of solvent and the concentration depends principally on the nature of the composition and on the coating method. The solution is applied uniformly to a substrate by known coating methods, e.g. by spin-coating, immersion, doctor coating, curtain coating, brushing, spraying and reverse roll coating. The add-on (layer thickness) and nature of the substrate (support) depend on the field of application. A suitable substrate for offset formes is specially treated aluminium, while copper-coated laminates are used for making printed circuits. The layer thicknesses for photographic materials and offset formes are about 0.1 to about 500 μm, and for printed circuits 1 to about 100 μm.

It is known that the photopolymerisation of acrylates and methacrylates and similar olefinically unsaturated compounds is inhibited by atmospheric oxygen, especially in thin layers. This effect can be diminished by means of known conventional methods, e.g. by applying a temporary covering layer of polyvinyl alcohol or by pre-exposure or preconditioning in an inert gas atmosphere.

After coating, the solvent is removed by drying to leave a layer of light-sensitive polymer on the support. After conventional imagewise exposure of the substrate through a photomask the unexposed parts of the polymer are dissolved out in a developer (solvent) and the polymer relief, consisting of crosslinked polymer, is exposed.

Examples of suitable developers are solvents or mixtures of solvents such as N-methylpyrrolidone, N-acetylpyrrolidone, 4-butyrolactone, ethylene glycol monomethyl ether, dimethylformamide, dimethylacetamide, dimethylsulfoxide and cyclohexanone with non-solvents such as toluene, xylene, ethanol, methanol or acetone.

The light-sensitivity of the materials of this invention extends from the UV range (200 nm) to about 600 nm and thus encompasses a very broad range. Accordingly, a large number of the most different types of light sources may be used. Both point sources of light and spatial radiators (arrays of lamps) are suitable. Examples of such light sources are: carbon arc lamps, xenon arc lamps, mercury vapour lamps which may be doped with metal halides (metal halide lamps), fluorescent lamps, argon filament lamps, electronic flash lamps and photographic floodlight lamps. Particularly suitable lamps are those having a comparatively high radiation intensity in the spectral range from 400–480 nm. The distance between lamp and the image material of this invention can vary greatly, depending on the intended purpose and the type or strength of lamp, e.g. from 2 cm to 150 cm. Particularly suitable are laser light sources, e.g. argon ion lasers or krypton ion lasers with strong emission lines (Ar lasers) at 457, 476, 488, 514 and 528 nm. In this type of exposure, a photomask in contact with the photopolymer layer is no longer necessary: the guided laser beam writes directly onto the layer. Here the high sensitivity of the materials of the invention is very advantageous and permits high writing speeds at relatively low intensities. Using this method it is possible to produce printed circuits in the electronics industry, lithographic offset printing plates or relief printing plates, as well as photographic image recording materials.

The most important utilities are as discharge resist, galvanoresist and soldering resist for the production of printed circuits and printing plates, for the production of photopolymer printing plates for offset printing, letterpress (relief) printing, as well as for flexographic and silk screen printing as finishing lacquer and for the production of photographic image recording materials, e.g. as disclosed in De-A-No. 26 51 864 or DE-A-No. 22 02 360.

The main utility is the production of heat- and chemical-resistant relief structures of e.g. about 0.05 to 500 μm thickness on electronic components such as condensers, discrete semiconductors, integrated circuits, hybrid circuits, printed circuit boards, liquid crystal displays and photosensors. In particular, the compositions of this invention are suitable for application to active components, for example as passivators, especially as α-ray inhibitors for memory components (relatively thick layers) or as dielectric substance for multilayer circuits (thinner layers). For this utility, the coated and, where appropriate, imagewise exposed and developed materials are baked to images which are resistant to high temperatures, preferably in the temperature range from 300° to 400° C., in the course of which heat treatment the conversion to ring structures takes place and volatile constituents are removed.

The compositions employed in the practice of this invention are distinguished by high light sensitivity over a wide absorption range extending to visible light, so that thicker layers also can be modified readily and economically in structures. A high resolution (up to about 1 μm) and excellent sharpness of definition are obtained. In addition, a less appreciable loss of thickness is observed and accurate images are obtained at a lower light intensity.

The following Examples illustrate the invention in more detail.

EXAMPLE 1

The following components are used: a polyamide ester (prepolymer 1) consisting of structural units of the formula

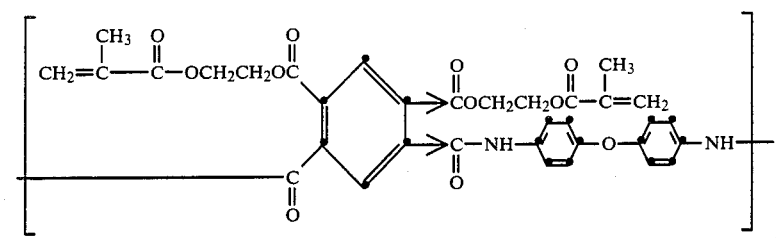

| | |
|---|---|
| ($M_w^- = 14,000$) | 31 g |
| N—methylpyrrolidone (NMP) | 69 g |
| di-$\pi$-cyclopentadienyl-Ti-bis-(2,3,4,5,6-pentafluorophen-1-yl) [$(Cp)_2Ti(C_6F_5)_2$] (photoinitiator 1) | 1.55 g |
| tetraethylene glycol dimethacrylate | 3.1 g |
| Orasol Blue | 0.4 g |

The components are mixed and dissolved and the solution is applied with a doctor coating machine to aluminium substrates (thickness of the undried layer about 12 μm). After the coated substrates have been dried for 10 minutes at 70° C. in a circulating air oven, exposure is made with a metal halide lamp. Development is then carried out for 22 seconds in an immersion bath consisting of toluene and 4-butyrolactone in the ratio 1:1 at a temperature of 23° C. At a lamp intensity of 37.5 mW/cm$^2$ and a substrate temperature of almost 23° C., an exposure time of only 1 second is required to produce 2-3 steps with a Stouffer neutral grey wedge.

EXAMPLE 2

| | |
|---|---|
| prepolymer 2 (as in Example 1 but with $M_w^- = 19,000$) | 31 g |
| NMP | 69 g |
| $(Cp)_2Ti(C_6F_5)_2$ | 0.93 g |
| tetraethylene glycol dimethacrylate | 4.65 g |
| vinyl tris(2-methoxyethoxy)silane | 0.31 g |

The final solution is filtered through a 1.2 μm Teflon absolute filter and spin-coated at 4000 rpm for 20 sec. on SiO$_2$-coated silicon wafers. The coated substrates are dried for 10 minutes at 70° C. in a circulating air oven. Vacuum-contact exposure is made with a mercury high-pressure lamp with additional nitrogen scavenging at at a substrate temperature of 23° C. Developing is carried out by spraying on a mixture of toluene and 4-butyrolactone in the ratio 2:1 in a spray developer (at a pressure of 2 bar) according to the following programme:

| 1. | toluene/butyrolactone 2:1 | 5 sec. |
|---|---|---|
| 2. | toluene/butyrolactone 5:1 | 3 sec. |
| 3. | toluene | 3 sec. |

The exposure time is determined exactly by using a black chromium mask with test structures of 1 μm, 2 μm ... 10 μm, 20 μm ... 100 μm size. The exposure time is taken as the time in which a sufficiently good 1:1 image of all structures (grooves and ridges) is observed as being greater than twice the layer thickness. An exposure time of only 18 seconds (corresponding to 116 mJ/cm$^2$) is required at a light intensity of 6.45 mW/cm$^2$. The layer thickness is 2.10 μm and the 3 μm structures are still of good resolution. Even at an exposure time of only 5 sec. sharply defined relief structures are still observed. The relief structures so obtained are then put into an oven, heated for 30 minutes to 275° C., kept at this temperature for another 30 minutes and then heated to a final temperature of 400° C. over 45 minutes. The converted, sharply defined relief structures have a layer thickness of 1.10 μm.

EXAMPLE 3

| | |
|---|---|
| prepolymer 1 ($M_w^- = 14,000$) | 45 g |
| NMP | 55 g |
| $(Cp)_2Ti(C_6F_5)_2$ | 1.35 g |
| tetraethylene glycol dimethacrylate | 6.75 g |
| vinyl tris(2-methoxyethoxy)siloxane | 0.45 g |

The final solution is filtered through a 2.7 μm filter and spincoated at 800 rpm on an SiO$_2$-coated wafer. The coated substrate is dried for 3½ hours at 70° C. in a circulating air oven. Vacuumcontact exposure is made using a mask. Development is carried out in a spray developer by spraying the substrate with a 2:1 mixture of toluene/4-butyrolactone according to the following programme:

| 1. | toluene/butyrolactone 2:1 | 90 sec. |
|---|---|---|
| 2. | toluene/butyrolactone 5:1 | 3 sec. |
| 3. | toluene | 8 sec. |

An exposure time of 50 sec. is required at a light intensity of 27.8 mW/cm$^2$ in order to produce sharp structures with a smooth surface and having a coating thickness of 62 μm. The contours are very sharply defined and no detaching of the structures is observed. The relief structures so obtained are then cured by heating them to 400° C. over 3½ hours and keeping this temperature for 30 minutes. The final layer thickness is 38 μm.

EXAMPLES 4-6

The procedure of Example 2 is repeated. The results are reported in Table I, with the results for Example 2 also being included. The light intensity is measured with an OAI Power Meter Model 206 of Optical Associates Inc. All data relate to the 365 nm probe. The layer thicknesses are measured with an Alpha-Step profilometer (available from Tencor).

TABLE I

| Example | Photoinitiator in % by weight | Acrylate/methacrylate | Exposure time (sec) | Layer thickness after development ($\mu$m) | Layer thickness after heat treatment*** ($\mu$m) | Light intensity (mJ/cm$^2$) |
|---|---|---|---|---|---|---|
| 4 | (Cp)$_2$Ti(C$_6$F$_5$)$_2$ 3 | TMPTA* 15 | 38 | 2.10 | 1.20 | 245.1 |
| 5 | (Cp)$_2$Ti(C$_6$F$_5$)$_2$ 5 | TMPTA 20 | 21 | 2.20 | 1.15 | 135.5 |
| 2 | (Cp)$_2$Ti(C$_6$F$_5$)$_2$ 3 | TGDM** 15 | 18 | 2.10 | 1.10 | 116.1 |
| 6 | (Cp)$_2$Ti(C$_6$F$_5$)$_2$ 5 | TGDM 20 | 11 | 2.10 | 1.05 | 70.0 |

*trimethylolpropanetriacrylate
**tetraethyleneglycol dimethacrylate
Cp = $\pi$-cyclopentadienyl
***according to Example 2

EXAMPLES 7-15
(Table II)

The procedure of Example 2 or Example 3 is carried out, using di-$\pi$-methylcyclopentadienyl-Ti-bis(2,3,4,5,6-pentafluorophen-1-yl) [(CH$_3$-Cp)$_2$Ti(C$_6$F$_5$)$_2$] (photoinitiator 2) and different components (c) as well as the following prepolymer: prepolymer 3 as prepolymer 1, but with a molecular weight of (M$^-_w$) 10,000. The photoinitiator is used in each Example in an amount of 3% by weight, based on the prepolymer.

EXAMPLES 16-25
(Table III)

The procedure of Example 3 is carried out using prepolymer 3, 10% by weight of tetraethylene glycol dimethacrylate and 3% by weight of further different photoinitiators, based on the prepolymer.

TABLE II

| Example | Component (c) | % by weight | Layer thickness after development ($\mu$m) | Layer thickness* after heat treatment ($\mu$m) | Light intensity (mJ/cm$^2$) |
|---|---|---|---|---|---|
| 7 | none | — | 1.70 | 0.94 | 6 500 |
| 8 | 1,1,1-trimethylolpropan triacrylate | 15 | 2.12 | 1.21 | 990 |
| 9 | tetraethyleneglycol dimethacrylate | 15 | 1.65 | 0.84 | 470 |
| 10 | none | — | 70.5 | 43.6 | 12 000 |
| 11 | tetraethyleneglycol dimethacrylate | 10 | 68.8 | 41.6 | 3 000 |
| 12 | tetraethyleneglycol dimethacrylate | 15 | 66.5 | 39.2 | 1 800 |
| 13 | polyethyleneglycol 200 dimethacrylate | 15 | 76.2 | 44.2 | 1 500 |
| 14 | polyethyleneglycol 400 diacrylate | 15 | 68.3 | 39.1 | 1 200 |
| 15 | pentaerythritol triallyl ether | 15 | 69.1 | 40.8 | 3 200 |

*according to Example 2 or 3

TABLE III

| Example | Photoinitiator | Chemical structure | Layer thickness after development [$\mu$m] | Layer thickness after heat treatment [$\mu$m] | Exposure time [sec] at 30 mW/cm$^2$ | Light intensity (mJ/cm$^2$) |
|---|---|---|---|---|---|---|
| 16 | 1 | 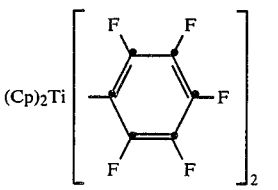 (Cp)$_2$Ti | 61.3 | 39.2 | 120 | 3600 |
| 17 | 2 | 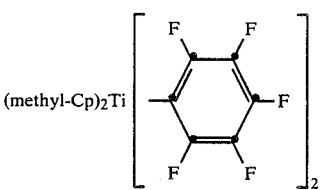 (methyl-Cp)$_2$Ti | 68.8 | 41.6 | 100 | 3000 |
| 18 | 3 | 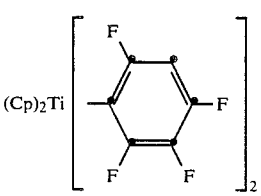 (Cp)$_2$Ti | 68.2 | 41.1 | 45 | 1350 |

TABLE III-continued

| Example | Photo-initiator | Chemical structure | Layer thickness after development [μm] | Layer thickness after heat treatment [μm] | Exposure time [sec] at 30 mW/cm² | Light intensity (mJ/cm²) |
|---|---|---|---|---|---|---|
| 19 | 4 | (Cp)₂Ti[C₆F₄]₂ | 64.7 | 39.5 | 75 | 2250 |
| 20 | 5 | (methyl-Cp)₂Ti[C₆F₄]₂ | 68.0 | 40.4 | 250 | 7500 |
| 21 | 6 | (Cp)₂Ti[C₆F₃H]₂ | 70.1 | 41.0 | 45 | 1350 |
| 22 | 7 | (methyl-Cp)₂Ti[C₆F₃H]₂ | 62.4 | 38.0 | 100 | 3000 |
| 23 | 8 | (methyl-Cp)₂Ti[C₆F₂H₂]₂ | 69.5 | 41.6 | 70 | 2100 |
| 24 | 9 | (Cp)₂Ti[C₆F₃Cl₂]₂ | 65.0 | 39.5 | 900 | 27000 |
| 25 | 10 | (Cp)₂Ti[C₆F₄-N(morpholino)]₂ | 61.3 | 39.2 | 120 | 3600 |

It is evident from Tables I–III that, when using prepolymers having molecular weights in the range from about 10,000 to 50,000, a greater light sensitivity is in general obtained with higher molecular weights. Likewise, the concurrent use of components (c), in particular acrylates and methacrylates, increases the light sensitivity. Finally, Tables I–III also show that, in the practice of this invention, it is also possible to photopolymerise substantial layer thicknesses using short exposure times. In particular, with increasing layer thickness the required exposure energy increases comparatively little.

EXAMPLES 26–38

(Table IV)

The procedure of Example 2 or 3 is carried out using different photoinitiators and components (c) as well as the following prepolymers and prepolymer 1.

Prepolymer 4 ($M^-{}_w$=11,000) consisting of recurring structural units of the formula

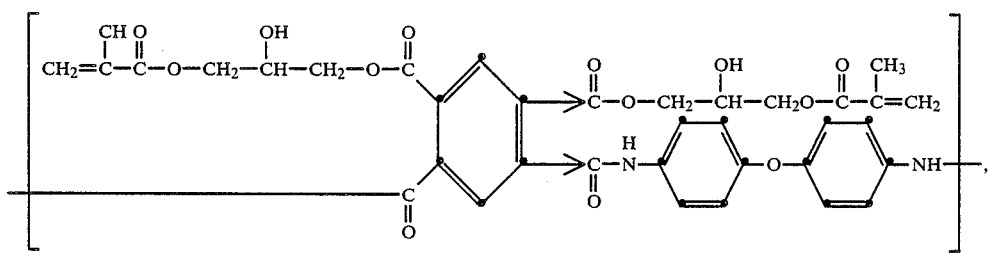

prepared according to the process described in European patent application No. 84264.

Prepolymer 5 ($M^-{}_w$=12,000) consisting of recurring structural units of the formula

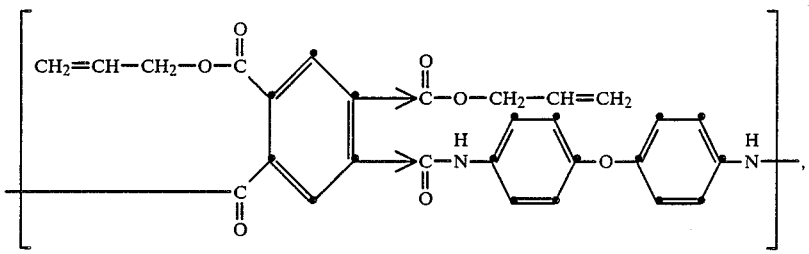

prepared according to the process of DE-OS No. 2 308 830.

Prepolymer 6 consisting of recurring structural units of the formula

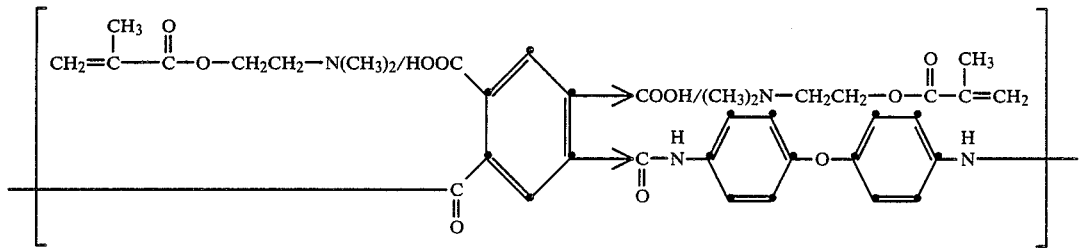

prepared by mixing the corresponding polyamic acid (obtained from 4,4'-diaminodiphenyl ether and pyromellitic dianhydride) with 2-(N,N-dimethylamino)ethylmethacrylate (q.v. European patent application No. 65352).

Prepolymer 7 consisting of recurring structural units of the formula

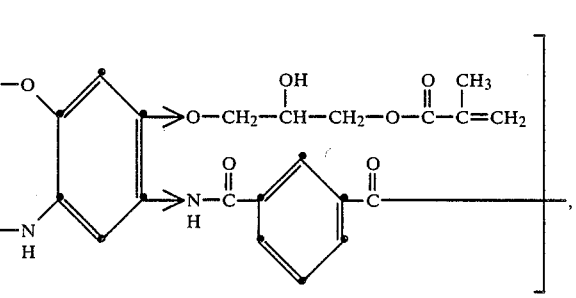

prepared according to the process described in DE-OS No. 2 933 805.

Prepolymer 8 consisting of recurring structural units of the formula

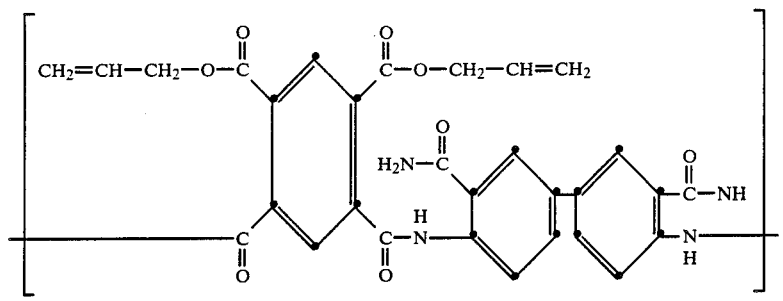

prepared according to the process described in DE-OS No. 2 308 830 and No. 2 437 397.

The results and further processing conditions are summarised in Table IV.

to room temperature. After 1½ hours the mixture is poured into water, extracted with ether and the ethereal extract is dried over MgSO$_4$. The solvent is distilled, affording as residue a white solid which is distilled at

TABLE IV

| Example | Pre-polymer | Photoini-tiator | % by weight | Component (c) | % by weight | Developer* | Layer thickness after development [μm] | Layer thickness after heat treatment [μm] | Light intensity mJ/cm$^2$ |
|---|---|---|---|---|---|---|---|---|---|
| 26 | 4 | 2 | 3 | none | — | DMA/GBL 1:1 | 1.30 | 0.66 | 3000 |
| 27 | 4 | 2 | 3 | tetraethylene glycol dimethacrylate | 15 | DMA/GBL 1:1 | 1.25 | 0.72 | 148 |
| 28 | 4 | 2 | 3 | tetraethylene glycol dimethacrylate | 15 | DMA/GBL 1:1 | 40.5 | 21.5 | 495 |
| 29 | 5 | 2 | 3 | tetraethylene glycol dimethacrylate | 15 | DMF/toluene 1:2 | 0.80 | 0.46 | 420 |
| 30 | 6 | 2 | 3 | none | — | DMF/toluene 1:1.1 | 1.34 | 0.87 | 1200 |
| 31 | 6 | 2 | 3 | tetraethylene glycol dimethacrylate | 15 | DMF/toluene 1:1.1 | 1.01 | 0.71 | 480 |
| 32 | 6 | 3 | 7 | none | — | DMF/toluene 1:0.55 | 20.5 | 12.8 | 5700 |
| 33 | 6 | 3 | 7 | polyethylene glycol 400 dimethacrylate | 10 | DMF/toluene 1:0.55 | 13.5 | 6.4 | 4800 |
| 34 | 7 | 2 | 3 | tetraethylene glycol methacrylate | 15 | NMP/ethanol 1:5 | 8.3 | 4.2 | 480 |
| 35 | 8 | 2 | 3 | tetraethylene glycol methacrylate | 15 | dioxan/DMA 4:1 | 27.5 | 16.7 | 720 |
| 36 | 1 | 3 | 3 | tetraethylene glycol methacrylate | 15 | GBL/toluene 1:1 | 65.8 | 40.1 | 370 |
| 37 | 1 | 3 | 3 | tetraethylene glycol dimethacrylate | 15 | GBL/toluene 1:1 | 67.1 | 40.6 | 250 |
| 38 | 1 | 3 | 3 | tetraethylene glycol dimethacrylate | 15 | GBL/toluene 1:1 | 105 | 64.0 | 350 |

\* = volume ratios,
DMA = dimethylacetamide,
GBL = butyrolactone,
DMF = dimethylformamide
NMP = N—methylpyrrolidone The metallocenes of the formula II can be prepared as follows:

10 g (32.5 mmoles) of 1,4-dibromotetrafluorobenzene are dissolved, in an atmosphere of argon, in 100 ml of ether and 100 ml of tetrahydrofuran. The solution is cooled to −78° C. and then 21 ml of a 1.6 molar solution of butyllithium in hexane are added. After 15 minutes, 6.08 g (65 mmoles) of N,N-dimethylmethyleneimmonium chloride are added and the mixture is warmed 100° C. under a high vacuum. Yield: 7.8 g (84%) of a colourless product which is solid at room temperature.

25 g of bromopentafluorobenzene are dissolved in 750 ml of absolute ether and the solution is cooled to −78° C. in an atmosphere of argon. After addition of 62.5 ml of a 1.6 molar solution of butyllithium in hexane, stirring is continued for 15 minutes at −78° C., 12.5 g of Cp$_2$TiCl$_2$ in powder form are added and the cooling is removed. The mixture warms to room temperature over 2 hours. The orange suspension is concentrated and the residue is suspended in methylene chloride and the suspension is filtered. The orange product is precipitated by addition of hexane to the orange solution. The precipitate is dried in a high vacuum at room temperature, affording 23.6 g (92%) of $Cp_2Ti(C_6F_5)_2$ in the form of orange crystals which melt at 230° C. with decomposition.

The photoinitiators listed in Table III are prepared in corresponding manner. $Cp = \pi$-cyclopentadienyl.

What is claimed is:

1. A photopolymerizable composition which comprises,
   (a) a prepolymer which contains identical or different recurring structural units of the formula I

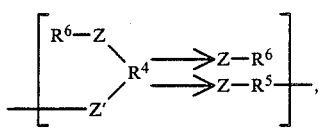

and which reacts, when heated, to form a thermostable ring structure, and
   (b) a photoinitiator,
wherein the photoinitiator (b) is a metallocene of the formula II

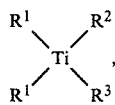

wherein
$R^1$ is each independently unsubstituted or substituted cyclopentadienyl$^\ominus$, indenyl$^\ominus$, or both symbols $R^1$ together are an unsubstituted or substituted radical of the formula III

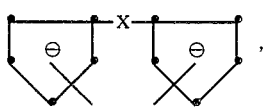

$R^2$ is a carbocyclic or 5- or 6-membered heterocyclic aromatic ring which is substituted in at least one of the two ortho-positions relative to the metal-carbon bond by a fluorine atom, $R^3$ is $C_3$–$C_5$alkynyl, substituted or unsubstituted phenylalkynyl containing 3 to 5 carbon atoms in the alkynyl moiety, $N_3$, CN, $Si(R^7)_3$ or $Sn(R^7)_3$, or has the meaning of $R^2$, or $R^2$ and $R^3$ together are a radical of the formula IV $$-Q-Y-Q- \quad (IV),$$

$R^4$ is a tetravalent aromatic radical after removal of four functional groups, with any two functional groups being adjacent and→denoting structural isomers, $R^5$ is a divalent aliphatic, cycloaliphatic or monocyclic or polycyclic aromatic radical, or aromatic radicals which contain a $-CONH_2$ or $-COOH$ group in the ortho-position to the bond to Z', $R^6$ is a radical containing a photopolymerisable olefinic double bond, $R^7$ is $C_1$–$C_{12}$alkyl, $C_5$–$C_{12}$cycloalkyl, $C_6$–$C_{16}$aryl or $C_7$–$C_{16}$aralkyl, Z is $-COO-$, $-CONH-$, $-O-$, $-NH-$, $-COOH/NR^{14}R^{15}-$ or

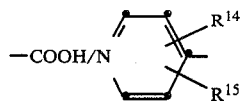

wherein/between amine and carboxyl groups denotes as ionic bond,

Z' is $-CONH-$, $-NHCO-$, $-NH-CO-NH-$ or $-O-CO-NH-$, and each of $R^{14}$ and $R^{15}$ is independently alkyl or alkenyl each having up to 6 carbon atoms, with the proviso that, on heating the photopolymerisable composition to remove the radical $R^6$, either Z and Z', or Z and Z' together with $-CONH_2$ or $-COOH$ groups contained in $R^5$, form a thermostable ring system, X is $(CH_2)_n$, in which n is 1, 2 or 3, $C_2$–$C_{12}$alkylidene, cycloalkylidene containing 5 to 7 ring carbon atoms, $Si(R^7)_2$ or $Sn(R^7)_2$, Q is a carbocyclic or heterocyclic 5- or 6-membered aromatic ring, each of the two bonds being in the ortho-position to the group Y and each meta-position to the group Y being substituted by a fluorine atom, and Q may contain further substituents, and Y is $CH_2$, $C_2$–$C_{12}$alkylidene, cycloalkylidene containing 5 to 7 ring carbon atoms, a direct bond, $NR^7$, O, S, SO, $SO_2$, CO, $Si(R^7)_2$ or $Sn(R^7)_2$.

2. A composition according to claim 1 which additionally contains
   (c) an ester of acrylic or methacrylic acid, an allyl ether or an allyl ester or a partial ester of said acids with a polyol.

3. A composition according to claim 2, which contains the photoinitiator (b) in an amount of 0.1 to 20% by weight, based on components (a) and (c).

4. A composition according to claim 2, which contains 50 to 97.5% by weight of component (a) and 2.5 to 50% by weight of component (c), based on components (a) and (c).

5. A composition according to claim 1, which contains the photoinitiator (b) in an amount of 0.1 to 20% by weight, based on component (a).

6. A composition according to claim 1, wherein Z is $-CONH-$, $-COO-$ or $-COOH/N(CH_3)_2-$ and Z' is $-CONH-$, or Z is $-O-$ and Z' is $-NHCO-$.

7. A composition according to claim 1, wherein $R^4$ is a radical of the formula V or VI

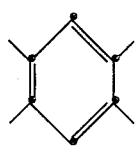

or

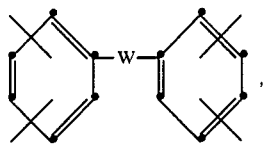

$R^5$ is a radical of the formula VII, VIII or IX

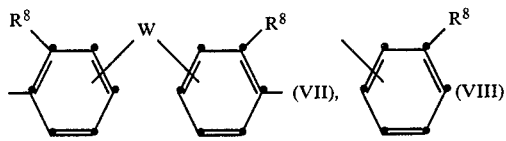

or

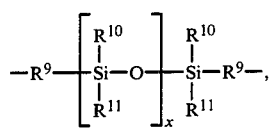

and $R^6$ is a radical of the formula X

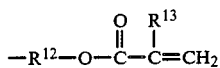

or,
if Z is —COO—, is also —CH=CH$_2$, —CH$_2$CH=CH$_2$ or —CH$_2$C(CH$_3$)=CH$_2$, in which formulae W is a direct bond, O, CO, CH$_2$, C(CF$_3$)$_2$, S, SO, SO$_2$, NH or C$_2$-C$_{12}$alkylidene, x is an integer from 1 to 10, $R^8$ is each independently a hydrogen atom, —CONH$_2$ or —COOH, $R^9$ is —C$_p$H$_{2p}$—, in which p=1 to 5, $R^{10}$ and $R^{11}$ are each straight chain or branched C$_1$-C$_6$alkyl, $R^{12}$ is —C$_m$H$_{2m}$—, in which m=2 to 12, —CH$_2$CH(OH)CH$_2$— or polyoxoalkylene containing 4 to 30 carbon atoms, and $R^{12}$ is a hydrogen atom or methyl, with the proviso that $R^4$, $R^5$ and $R^6$ in the individual structural units have identical or different meanings.

8. A composition according to claim 7, wherein $R^5$ in 0 to 100% of the recurring structural units is a radical of the formula VII and in 100 to 0% of the recurring structural units is a radical of the formula VIII.

9. A composition according to claim 7, wherein $R^5$ in 70 to 100% of the recurring structural units is a radical of the formula VII, formula VIII or mixtures thereof, and in 30 to 0% of the recurring structural units is a radical of the formula IX.

10. A composition according to claim 1, wherein the prepolymer (a) contains recurring structural units of the formula Ia

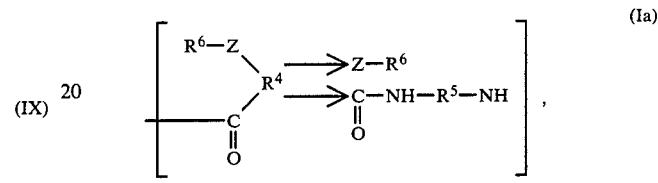

wherein $R^4$ is the tetravalent radical of an aromatic tetracarboxylic acid after removal of four carboxyl groups, and $R^5$, $R^6$ and Z are as defined in claim 1.

11. A composition according to claim 10, wherein Z is —CO—O—.

12. A composition according to claim 1, wherein the prepolymer (a) consists of recurring structural units of the formula Ic

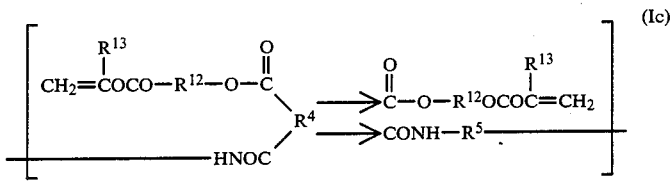

wherein $R^4$ is the radical of pyromellitic dianhydride, of a benzophenonetetracarboxylic dianhydride or a mixture of such radicals, each $R^5$ in the individual recurring structural units is independently 1,3- or 1,4-phenylene, the radical of 4,4'-diaminodiphenyl ether, 4,4'-diaminodiphenylmethane, 2,2-bis(4,4'-diaminodiphenyl)-hexafluoropropane, 4,4'-diamino-3-carboxamidodiphenyl ether or 4,4'-diamino-3,3'-biscarboxamidodiphenyl, $R^{12}$ is —CH$_2$CH$_2$— or —CH$_2$CH(OH)CH$_2$— and $R^{13}$ is a hydrogen atom or methyl.

13. A composition according to claim 1, wherein the prepolymer consists of recurring structural units of the formula Id

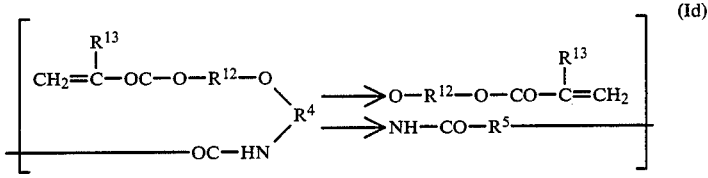

wherein $R^4$ is the radical of 3,3'-dihydroxybenzidine, each $R^5$ in the individual recurring structural units is independently 1,3-phenylene or is the radical of 4,4'-benzophenonediacarboxylic acid, $R^{12}$ is —CH- $_2$—CH$_2$—, —CH$_2$CH$_2$CH$_2$— or —CH$_2$CH(OH)CH$_2$—, and R$^{13}$ is a hydrogen atom or methyl.

14. A composition according to claim 2, wherein component (c) is an ester or a partial ester of acrylic or methacrylic acid and aliphatic polyols of 2 to 30 carbon atoms or cycloaliphatic polyols containing 5 or 6 ring carbon atoms.

15. A composition according to claim 1, wherein each of R$^2$ and R$^3$ in formula II is unsubstituted or substituted 2,6-difluorophen-1-yl or R$^2$ and R$^3$ together are a radical of the formula XI

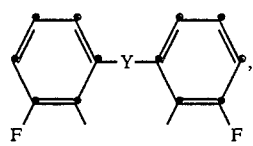

(XI)

wherein Y is a direct bond, CH$_2$ or O.

16. A composition according to claim 1, wherein each R$^1$ in formula II is unsubstituted or C$_1$-C$_4$alkyl-substituted π-cyclopentadienyl and each of R$^2$ and R$^3$ is a radical of the formula XII

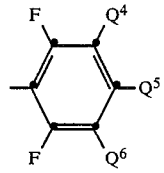

(XII)

wherein each of Q$^4$, Q$^5$ and Q$^6$ independently is H, F, Cl, Br or a tertiary amino group.

17. A composition according to claim 16, wherein each R$^1$ is unsubstituted or methyl-substituted π-cyclopentadienyl.

18. A composition according to claim 16, wherein each of Q$^4$, Q$^5$ and Q$^6$ independently is a hydrogen or fluorine atom.

19. A composition according to claim 16, wherein each of Q$^4$, Q$^5$ and Q$^6$ is a fluorine atom.

20. A coated substrate which contains on at least one substrate surface a layer of a photopolymerisable composition according to claim 1.

21. A process for the production of relief images on substrates, which comprises coating a substrate with a photopolymerisable composition according to claim 1 and exposing said layer imagewise, removing the unexposed parts with a solent and subsequently fixing the resultant image by baking to give an image which is resistant to high temperatures.

* * * * *